(12) United States Patent
Hsu et al.

(10) Patent No.: US 9,666,685 B2
(45) Date of Patent: May 30, 2017

(54) RF POWER TRANSISTOR

(71) Applicant: National Tsing Hua University, Hsinchu (TW)

(72) Inventors: Shuo-Hung Hsu, Hsinchu (TW); Chuan-Wei Tsou, Hsinchu (TW); Yi-Wei Lien, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/088,909

(22) Filed: Apr. 1, 2016

(65) Prior Publication Data

US 2016/0218205 A1 Jul. 28, 2016

Related U.S. Application Data

(63) Continuation-in-part of application No. 14/493,409, filed on Sep. 23, 2014, now abandoned.

(51) Int. Cl.
| | |
|---|---|
| *H01L 29/20* | (2006.01) |
| *H01L 29/66* | (2006.01) |
| *H01L 29/778* | (2006.01) |
| *H01L 29/06* | (2006.01) |
| *H01L 29/417* | (2006.01) |

(52) U.S. Cl.
CPC .... *H01L 29/66462* (2013.01); *H01L 29/0619* (2013.01); *H01L 29/7786* (2013.01); *H01L 29/2003* (2013.01); *H01L 29/41725* (2013.01)

(58) Field of Classification Search
CPC .......... H01L 21/28575; H01L 29/1029; H01L 29/2003; H01L 29/205; H01L 29/66212; H01L 29/66462; H01L 29/872
See application file for complete search history.

(56) References Cited

U.S. PATENT DOCUMENTS

| | | | |
|---|---|---|---|
| 2007/0202360 A1* | 8/2007 | Chaudhari | .......... H01L 29/7787 428/698 |
| 2011/0018002 A1* | 1/2011 | Chen | ................. H01L 21/28575 257/76 |

OTHER PUBLICATIONS

Tsou et al., "AlGaN/GaN HEMTs on Silicon with Hybrid Electrodes for Source-Drain Scaling and Frequency Dispersion Suppression", Institute of Electronics Engineering & Center for Nanotechnology, Material Science, and Microsystem of National Tsing Hua University, Hsinchu, Taiwan, Sep. 26, 2013.

* cited by examiner

*Primary Examiner* — Jaehwan Oh (74) *Attorney, Agent, or Firm* — Birch, Stewart, Kolasch & Birch, LLP (57) ABSTRACT

A radio frequency (RF) power transistor includes a semiconductor heterostructure, a gate electrode, a drain electrode and a source electrode. The drain electrode includes an ohmic contact and a Schottky contact extending from the ohmic contact toward the gate electrode, spaced apart from the gate electrode (4) by a distance ($L_{GD}$), and having a length ($L_{EXT}$) being not less than 2 μm and not greater than 4 μm. A ratio of the length ($L_{EXT}$) to a sum of the length ($L_{EXT}$) and a distance ($L_{GD}$) is greater than 0.83 and less than 0.98.

12 Claims, 6 Drawing Sheets

RF POWER TRANSISTOR

CROSS-REFERENCE TO RELATED APPLICATION

This application is a continuation-in-part of U.S. patent application Ser. No. 14/493,409, which is filed on Sep. 23, 2014.

FIELD

This invention relates to a radio frequency (RF) power transistor, and more particularly to an RF power transistor including a Schottky contact of a drain electrode.

BACKGROUND

Figure 1:
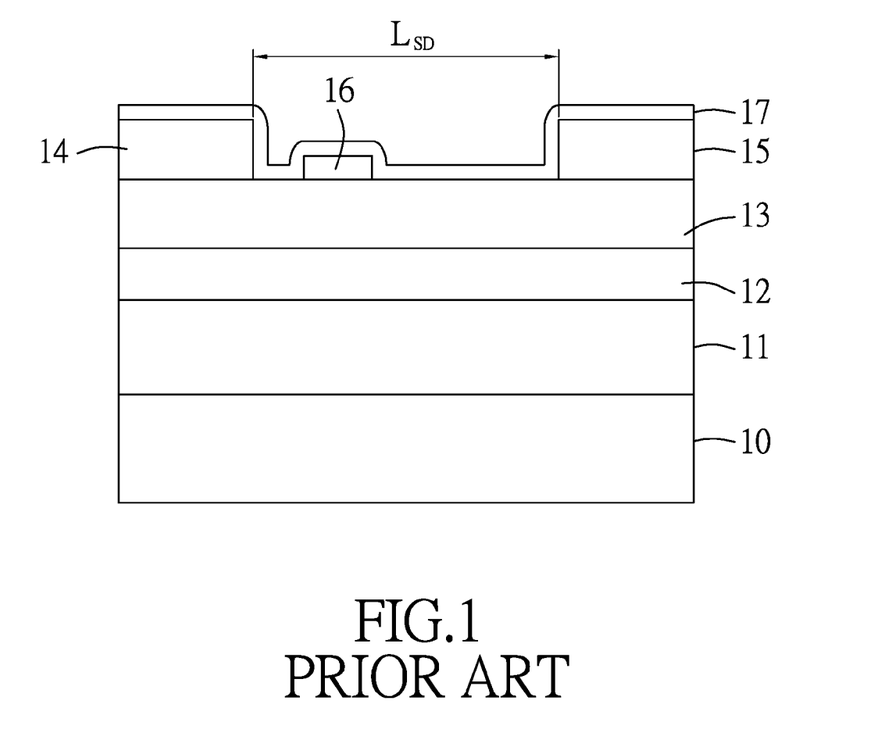
FIG. 1 is a schematic view of a conventional high electron mobility transistor (HEMT)

Conventional GaN-based high electron mobility transistors (HEMTs) are known to have a wide bandgap (3.4 eV) and a high electron saturation velocity ($2.5 \times 10^7 cm^2/s$), and are suitable for high frequency power amplifier applications. FIG. 1 illustrates a conventional HEMT that includes a substrate 10, a buffer layer 11 formed on the substrate 10, a GaN active layer 12 formed on the buffer layer 11, an AlGaN barrier layer 13 formed on the active layer 12, source and drain ohmic contacts 14, 15 formed on the barrier layer 13, a gate electrode 16 of a Schottky contact formed on the barrier layer 13, and a protection layer 17 formed on the source and drain electrodes 14, 15, the gate electrode 16 and the barrier layer 13. Conventionally, the source electrode 14 is spaced apart from the drain electrode 15 by a distance (source-to-drain distance, $L_{SD}$) that is typically around 2 μm.

Performance of the conventional HEMT at high frequencies must be enhanced for use as a radio frequency (RF) transistor.

SUMMARY

Therefore, an object of the disclosure is to provide a radio frequency (RF) power transistor that can alleviate at least one of the drawbacks of the prior art.

The RF power transistor includes a semiconductor heterostructure, a gate electrode, a drain electrode, and a source electrode.

The semiconductor heterostructure includes an active layer and a barrier layer that is formed on the active layer.

The gate electrode is disposed on the barrier layer of the semiconductor heterostructure.

The drain electrode includes an ohmic contact and a Schottky contact that are disposed on the barrier layer of the semiconductor heterostructure. The Schottky contact extends from the ohmic contact toward the gate electrode, is spaced apart from the gate electrode by a distance ($L_{GD}$) and includes a side face that faces the gate electrode. The Schottky contact has a length ($L_{EXT}$) from the side face to an interface that is between the ohmic contact and the Schottky contact.

The source electrode is disposed on the barrier layer and is spaced apart from the gate electrode, and includes an ohmic contact.

The gate electrode is disposed between the Schottky contact of the drain electrode and the ohmic contact of the source electrode.

The length ($L_{EXT}$) is not less than 2 μm and not greater than 4 μm. A ratio of the length ($L_{EXT}$) to a sum of the length ($L_{EXT}$) and the distance ($L_{GD}$) is greater than 0.83 and less than 0.98.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
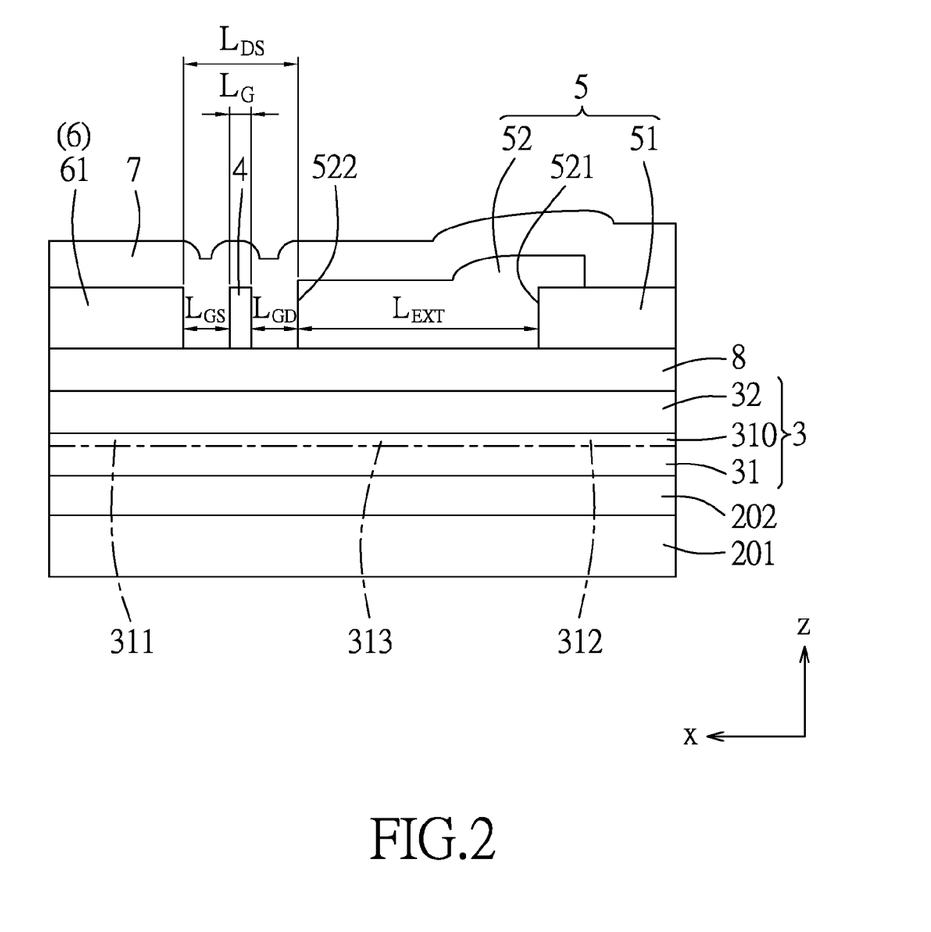
FIG. 2 is a schematic view of an embodiment of an RF (radio frequency) power transistor according to this disclosure.

FIG. 2 illustrates the embodiment of a radio frequency (RF) power transistor according to the present disclosure.

The RF power transistor is a GaN-based high electron mobility transistor (HEMT), and includes a substrate 201, a buffer layer 202 formed on the substrate 201, a semiconductor heterostructure 3 that is formed on the buffer layer 202, a gate electrode 4, a drain electrode 5, a source electrode 6, and a protective layer 7. The substrate 201, the buffer layer 202, and the semiconductor heterostructure 3 are stacked one above another along a stacking direction (z). The gate electrode 4, the drain electrode 5 and the source electrode 6 are arranged on the semiconductor heterostructure 3 in a first direction (x) perpendicular to the stacking direction (z).

The semiconductor heterostructure 3 includes an active layer 31 and a barrier layer 32 that is formed on the active layer 31. In this embodiment, the semiconductor heterostructure 3 is a III-N-type semiconductor, and the barrier layer 32 is undoped.

The gate electrode 4 is disposed on the barrier layer 32 of the semiconductor heterostructure 3.

The drain electrode 5 includes an ohmic contact 51 and a Schottky contact 52 that are disposed on the barrier layer 32 of the semiconductor heterostructure 3. The Schokkty contact 52 extends from the ohmic contact 51 toward the gate electrode 4 in the first direction (x). The Schokkty contact 52 is spaced apart from the gate electrode 4 by a distance ($L_{GD}$) in the first direction (x). The Schokkty contact 52 includes a side face 522 that faces the gate electrode 4 and has a length ($L_{EXT}$) in the first direction (x) from the side face 522 to an interface 521 that is between the ohmic contact 51 and the Schottky contact 52.

The source electrode 6 is disposed on the barrier layer 32 and spaced apart from the gate electrode 4. The source electrode 6 includes an ohmic contact 61.

The gate electrode 4 is disposed between the Schottky contact 52 of the drain electrode 5 and the ohmic contact 61 of the source electrode 6.

The length ($L_{EXT}$) is not less than 2 μm and not greater than 4 μm. A ratio of the length ($L_{EXT}$) to a sum of the length ($L_{EXT}$) and the distance ($L_{GD}$) is greater than 0.83 and less than 0.98.

In this embodiment, the active layer 31 is formed with a continuous two dimensional electron gas channel (2DEG) 310 that is disposed at one side of the active layer 31 which is adjacent to the barrier layer 32. The electron gas channel 310 has an ohmic source-aligned region 311, an ohmic drain-aligned region 312, and a Schottky drain-aligned region 313 that is disposed between the ohmic source-aligned region 311 and the ohmic drain-aligned region 312. The ohmic contacts 61 of the source electrode 6, the drain contact 51 and the Schokkty contact 52 of the drain electrode 5 are respectively aligned with the ohmic source-aligned region 311, the ohmic drain-aligned region 312, and the Schottky drain-aligned region 313 along the stacking direction.

In this embodiment, the electron gas channel 310 is normally on and extends continuously from the ohmic source-aligned region 311 to the ohmic drain-aligned region 312.

The Schottky contact 52 of the drain electrode 5 overlaps and is capacitively coupled to the Schottky drain-aligned region 313 of the electron gas channel 310.

In certain embodiments, the length ($L_{EXT}$) is greater than 2 μm and not greater than 4 μm. The ratio of the length ($L_{EXT}$) to the sum of the length ($L_{EXT}$) and the distance ($L_{GD}$) is less than 0.9.

In certain embodiments, the distance ($L_{GD}$) is not less than 0.1 μm and not greater than 0.4 μm. The length ($L_{EXT}$) ranges from 3 μm to 4 μm.

In one embodiment, the length ($L_{EXT}$) is 3 μm, the distance ($L_{GD}$) is 0.4 μm, and the ratio of the length ($L_{EXT}$) to the sum of the length and the distance ($L_{GD}$) is 0.88.

The gate electrode 4 is spaced apart from the ohmic contact 61 of the source electrode 6 in the first direction (x) by a distance ($L_{GS}$) that is greater than 0.1 μm and not greater than 0.4 μm.

In one embodiment, the substrate 201 is made from a material selected from the group consisting of silicon, silicon carbide, sapphire, and GaN.

In one embodiment, the buffer layer 202 is made from a material, such as AlN and GaN.

In one embodiment, the active layer 31 is made from a material that has a small bandgap, such as GaN.

In one embodiment, the barrier layer 32 is made from a material that has a large bandgap, such as AlGaN (e.g., $Al_{0.25}Ga_{0.75}N$). The bandgap of the barrier layer 32 is larger than that of the active layer 31. In addition, the barrier layer 32 may be optionally capped by a capping layer 8 (see FIG. 2) of GaN, which prevents the barrier layer 32 from oxidation.

In one embodiment, the ohmic contact 51, 61 of each of the drain and source electrodes 5, 6 is a metal stack, such as a four-layer (Ti/Al/Ni/Au or Ti/Al/Ti/Au) metal stack, and is formed using physical vapor deposition techniques, followed by annealing.

In this embodiment, the ohmic contact 61 of the source electrode 6 and the ohmic contact 51 of the drain electrode 5 are made from an alloy including Ti, Ai, Ni, and Au. In detail, each of the ohmic contact 61 of the source electrode 6 and the ohmic contact 51 of the drain electrode 5 is a four-layer (Ti/Al/Ni/Au) metal stack that is formed using e-gun evaporation techniques, followed by rapid thermal annealing under 800° C. for 30 seconds in $N_2$ atmosphere.

In one embodiment, the gate electrode 4 has a length ($L_G$) of 0.2 μm in the first direction (x). The gate electrode 4 has a structure of Ni (40 nm)/Au (350 nm) Schottky metal stack that is formed using e-gun evaporation techniques and lift-off techniques.

In one embodiment, the Schottky contact 52 of the drain electrode is a metal stack, such as a two-layer (Ni/Au, Ti/Au, or Pt/Au) metal stack, and is formed using physical vapor deposition techniques.

In this embodiment, the Schottky contact 52 of the drain electrode 5 is made from an alloy including Ti and Au. In detail, the Schottky contact 52 of the drain electrode 5 has a structure of Ti (30 nm)/Au (200 nm), and is made from a material that has a lower function than that of the gate electrode, so that the RF power transistor according to this disclosure has a relatively low onset voltage.

In one embodiment, the protective layer 7 may be made from a material, such as $SiN_x$, $Al_2O_3$, and AlN.

In one embodiment, the protective layer 7 has a multi-layered structure of $SiN_x$ (100 nm)/$SiO_2$ (300 nm)/$SiN_x$ (100 nm).

<Performance Test>

A sample device of the aforesaid conventional RF power transistor of FIG. 1 (referred herein to as Device A) and the embodiment of FIG. 2 (referred herein to as Device D) were prepared for performance tests. Device A had a source-to-gate distance ($L_{GS}$) equal to 0.4 μm, a gate length ($L_G$) equal to 0.2 μm, and a drain-to-gate distance ($L_{GD}$) equal to 1.4 μm. Device D had a source-to-gate distance ($L_{GS}$) equal to 0.4 μm, a gate length ($L_G$) equal to 0.2 μm, a Schokkty contact length ($L_{EXT}$) of 3 μm, and a drain-to-gate distance ($L_{GD}$) equal to 0.4 μm. Each of Device A and Device D had a gate width of 100 μm in a second direction (not shown) that is perpendicular to the stacking direction (z) and the first direction (x).

Devices B, C and E were also prepared for performance tests. Devices B, C and E are similar to Device D except for the length of the Schokkty contact ($L_{EXT}$). The length parameters for Devices A to E are listed in Table 1.

TABLE 1

| Device | A | B | C | D | E |
|---|---|---|---|---|---|
| $L_{GS}$ | 0.4 μm | 0.4 μm | 0.4 μm | 0.4 μm | 0.4 μm |
| $L_G$ | 0.2 μm | 0.2 μm | 0.2 μm | 0.2 μm | 0.2 μm |
| $L_{GD}$ | 1.4 μm | 0.4 μm | 0.4 μm | 0.4 μm | 0.4 μm |
| $L_{EXT}$ | 0 | 1 μm | 2 μm | 3 μm | 4 μm |
| $L_{EXT}/(L_{EXT} + L_{GD})$ | 0 | 0.714 | 0.882 | 0.833 | 0.909 |

Figure 3:
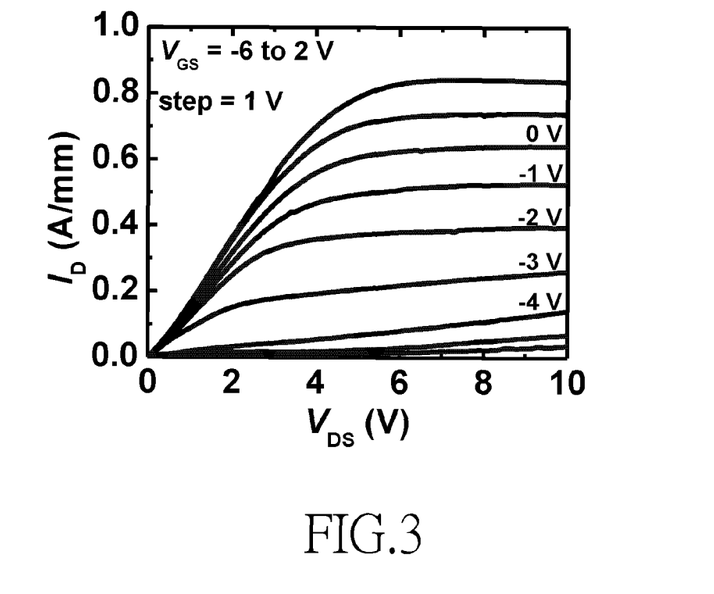
FIG. 3 is a plot of a drain current vs. a DC bias drain-source voltage ($V_{DS}$) for Device A under different gate-source voltages.
Figure 4:
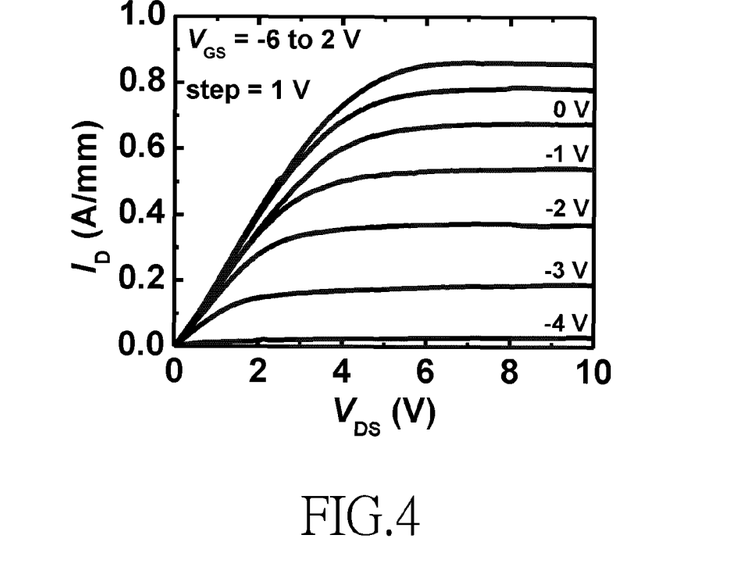
FIG. 4 is a plot of a drain current vs. a DC bias drain-source voltage for Device D under different gate-source voltages.

FIG. 3 is a plot of a drain current ($I_D$) vs. a DC (direct current) bias drain-source voltage ($V_{DS}$) of Device A under different gate-source voltages. FIG. 4 is a plot of a drain current ($I_D$) vs. a DC bias drain-source voltage ($V_{DS}$) of Device C under different gate-source voltages. The results indicate that the maximum drain currents ($I_D$) of Device A and Device D are similar.

Figure 5:
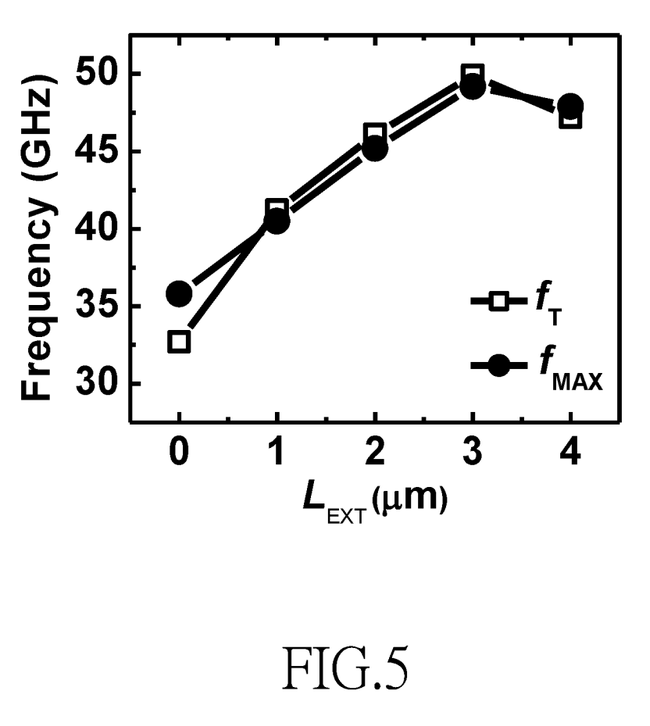
FIG. 5 is a plot showing the relationship between frequency and $L_{EXT}$.

FIG. 5 is a plot showing the relationship between the frequency and the length ($L_{EXT}$) of the Schottky contact 52 of the drain contact 5 measured under a DC bias drain-source voltage ($V_{DS}$) of 10 V and a DC bias gate voltage ($V_{GS}$) of −3 V. In FIG. 5, the square symbol represents the maximum cutoff frequency ($f_T$), and the circle symbol represents the maximum oscillation frequency ($f_{MAX}$). The results indicate that the maximum cutoff frequencies ($f_T$) and the maximum oscillation frequencies ($f_{MAX}$) at $L_{EXT}$ of 2, 3, 4 μm (i.e., Devices C, D and E) are better than $f_T$ and $f_{MAX}$ at $L_{EXT}$ of 0 and 1 μm (i.e., Devices A and B). Particularly, Device D with the length ($L_{EXT}$) of 3 μm exhibits the maximum $f_T$ and the maximum $f_{MAX}$.

Figure 6:
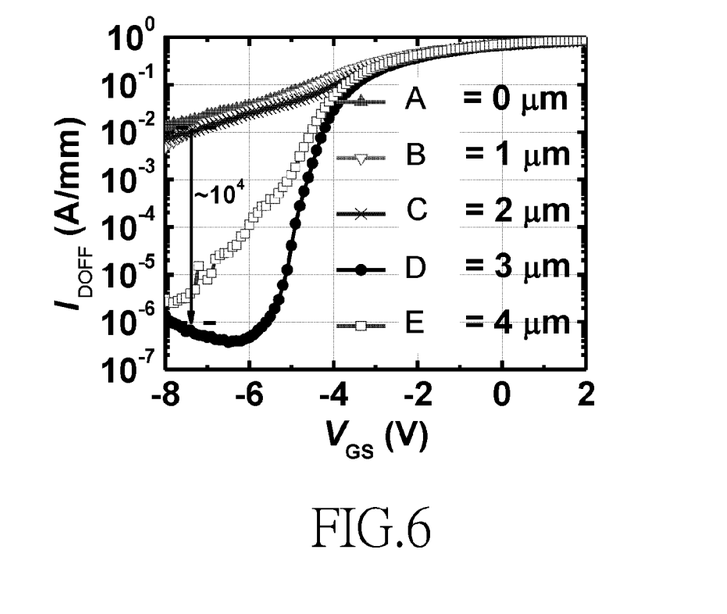
FIG. 6 is a plot of a drain leakage current and a DC bias gate-source voltage for Devices A, B, C, D and E.
Figure 7:
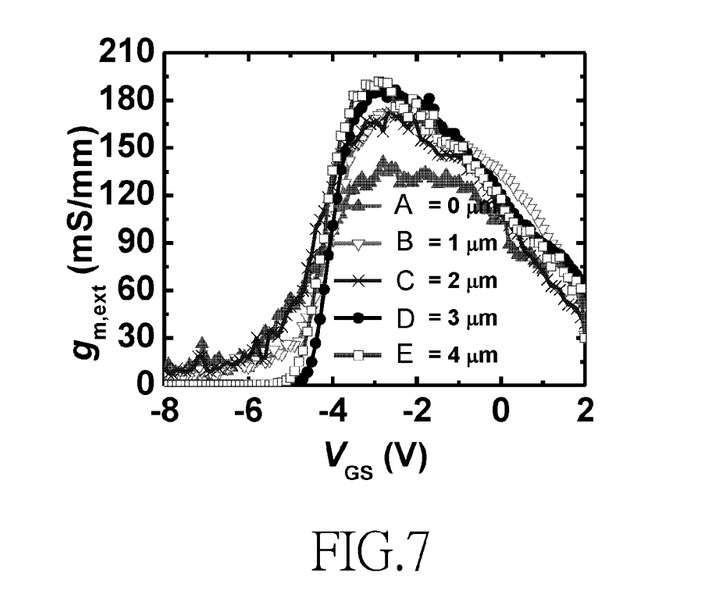
FIG. 7 is a plot of the DC transconductance as a function of a DC bias gate-source voltage for Devices A, B, C, D and E.

FIG. 6 is a plot of a drain leakage current ($I_{DOFF}$) and a DC bias gate-source voltage ($V_{GS}$) for Devices A, B, C, D and E under a DC bias source-drain voltage ($V_{DS}$) of 10V. FIG. 7 is a plot of the DC transconductance ($g_m = \Delta I_D / \Delta V_{GS}$) as a function of a DC bias gate-source voltage ($V_{GS}$) for Devices Device A, B, C, D and E under a fixed DC bias source-drain voltage ($V_{DS}$) of 10V. The DC characteristics measurement was conducted using Agilent B1500A Semiconductor Device Analyzer.

The results indicate that the Device D (with $L_{EXT}$ of 3 μm and $L_{EXT}/(L_{EXT}+L_{GD})$ of 0.882) and Device E (with $L_{EXT}$ of 4 μm and $L_{EXT}/(L_{EXT}+L_{GD})$ of 0.909) have reduced drain leakage current ($I_{DOFF}$). In particular, the drain leakage current of Device D can be suppressed by about four orders of magnitude compared with Device A. The Schottky drain contact 52 having specific ranges of $L_{ext}$ and $L_{EXT}/(L_{EXT}+L_{GD})$ acts as a drain-side electric field plate and can redistribute the electric field of the device, so that the peak intensity of the electric field near the ohmic drain contact 51 of the drain electrode 5 can be reduced. It is noted that a relatively high drain leakage current is observed in the device with $L_{ext} \leq 2$ μm (i.e., Devices B and D). This indicates that a significant punch through effect still occurs in the device if a relatively small $L_{ext}$ is used. With a small $L_{ext}$ and relatively low $L_{EXT}/(L_{EXT}+L_{GD})$, the redistribution of the electric field due to the Schottky drain contact 52 may not be very efficient, and a high electric field would still exist in the active layer/buffer layer near the edge of the ohmic drain contact 51. It is also noted that the drain leakage current slightly increases when the $L_{ext}$ is increased to 4 μm, which may indicate that the electric field at the edge of the Schottky drain contact 52 dominate the drain leakage current as $L_{ext}$ further increases.

Figure 8:
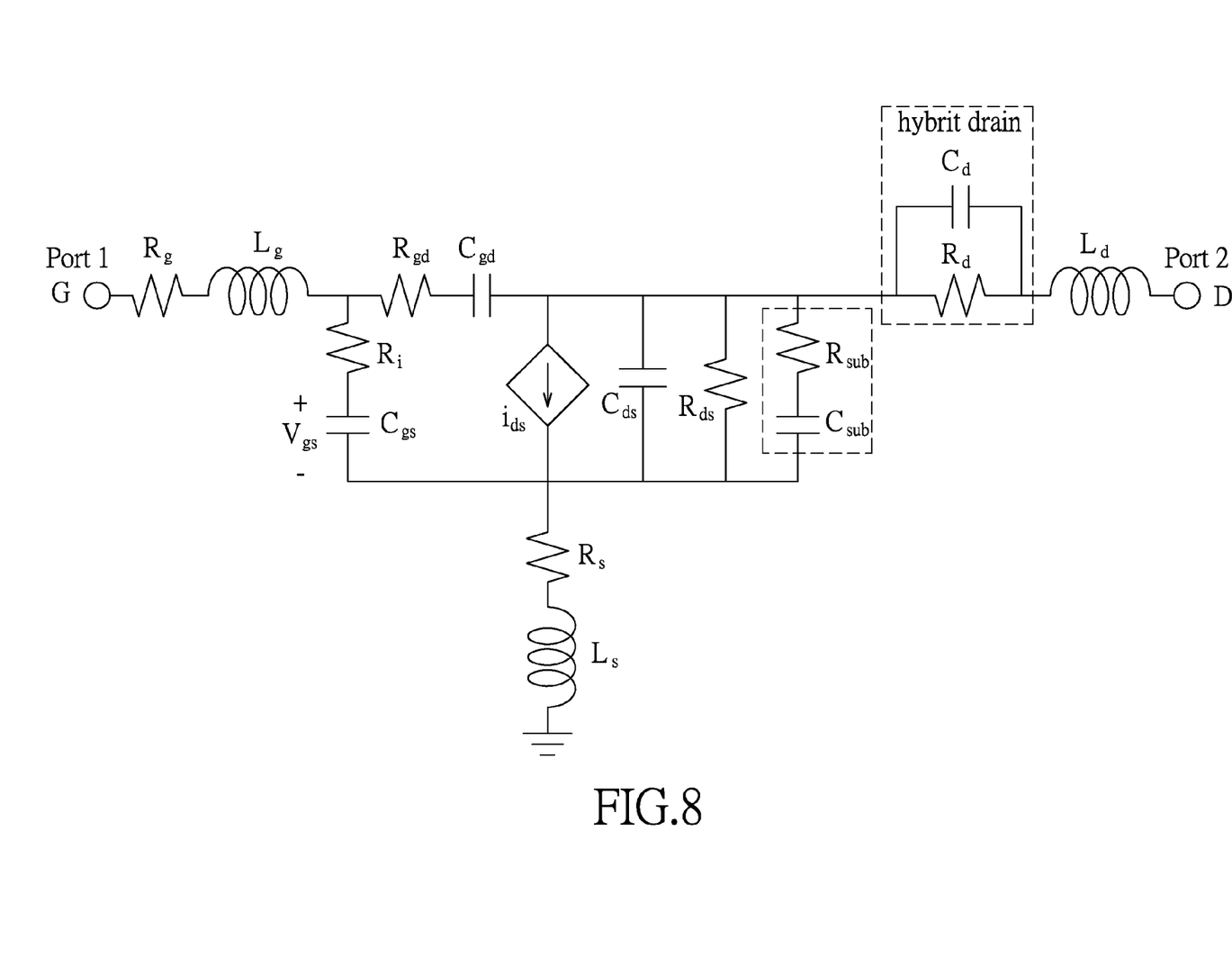
FIG. 8 is a small-signal model of the embodiment of the RF power transistor according to this disclosure.

FIG. 8 is a small-signal model of the embodiment of the RF power transistor according to this disclosure. The Schottky contact is modeled as a capacitance $C_d$ and a resistance $R_d$ that are parallel to each other (as shown in a circular region in FIG. 8). An equivalent impedance of the drain electrode 5 is lower than that of the conventional transistor shown in FIG. 1.

In summary, with the particular range of $L_{EXT}$ and the specific range of the ratio of $L_{EXT}/(L_{EXT}+L_{GD})$, the leakage current may be reduced. Furthermore, the cutoff frequencies ($f_T$) and the maximum oscillation frequencies ($f_{MAX}$) can be improved.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A radio frequency (RF) power transistor comprising:
   a semiconductor heterostructure including an active layer and a barrier layer that is formed on said active layer,
   a gate electrode disposed on said barrier layer of said semiconductor heterostructure; and
   a drain electrode including an ohmic contact and a Schottky contact that are disposed on said barrier layer of said semiconductor heterostructure, said Schottky contact extending from said ohmic contact toward said gate electrode, spaced apart from said gate electrode by a distance ($L_{GD}$), and including a side face that faces said gate electrode, said Schottky contact having a length ($L_{EXT}$) from said side face to an interface that is between said ohmic contact and said Schottky contact; and
   a source electrode disposed on said barrier layer, spaced apart from said gate electrode, and including an ohmic contact;
   wherein said gate electrode is disposed between said Schottky contact of said drain electrode and said ohmic contact of said source electrode;
   wherein the length ($L_{EXT}$) is not less than 2 μm and not greater than 4 μm, and a ratio of the length ($L_{EXT}$) to a sum of the length ($L_{EXT}$) and the distance ($L_{GD}$) is greater than 0.83 and less than 0.98.

2. The RF power transistor of claim 1, wherein the ratio of the length ($L_{EXT}$) to a sum of the length ($L_{EXT}$) and the distance ($L_{GD}$) is less than 0.9.

3. The RF power transistor of claim 1, wherein the distance ($L_{GD}$) is not less than 0.1 μm and not greater than 0.4μm.

4. The RF power transistor of claim 1, wherein the length (LEXT) ranges from 3 μm to 4 μm.

5. The RF power transistor of claim 4, wherein the length ($L_{EXT}$) is 3 μm, the distance ($L_{CD}$) is 0.4 μm, and the ratio of the length ($L_{EXT}$) to the sum of the length ($L_{EXT}$) and the distance ($L_{GD}$) is 0.88.

6. The RF power transistor of claim 1, wherein said gate electrode is spaced apart from said ohmic contact of said source electrode by a distance ($L_{GS}$) that is greater than 0.1 μm and not greater than 0.4 μm.

7. The RF power transistor of claim 1, wherein said active layer is formed with a continuous two dimensional electron gas channel disposed at one side of said active layer which is adjacent to said barrier layer, said electron gas channel having an ohmic source-aligned region, an ohmic drain-aligned region, and a drain Schottky-aligned region that is disposed between said ohmic source-aligned region and said drain-aligned regions,
   said ohmic contacts of said source and drain electrodes and said Schottky contact of said drain electrode being aligned with said ohmic source and drain-aligned regions and said drain Schottky-aligned region, respectively,
   said electron gas channel being normally on and extending continuously from said ohmic source-aligned region to said ohmic drain-aligned region, said Schottky contact of said drain electrode overlapping and being capacitively coupled to said drain Schottky-aligned region of said electron gas channel.

8. The RF power transistor of claim 1, wherein said barrier layer is made from AlGaN.

9. The RF power transistor of claim 1, wherein said active layer is made from GaN.

10. The RF power transistor of claim 1, wherein said ohmic contact of said drain electrode and said ohmic contact of said source electrode are made from an alloy including Ti, Al, Ni, and Au.

11. The RF power transistor of claim 1, wherein said Schottky contact of said drain electrode is made from an alloy including Ti and Au.

12. The RF power transistor of claim 1, wherein said Schottky contact of said drain electrode is made from an alloy including Ni and Au.

* * * * *